(12) United States Patent
Mori et al.

(10) Patent No.: US 6,898,661 B2
(45) Date of Patent: May 24, 2005

(54) SEARCH MEMORY, MEMORY SEARCH CONTROLLER, AND MEMORY SEARCH METHOD

(75) Inventors: Masaya Mori, Kawasaki (JP); Toshio Sunaga, Ohtsu (JP); Shinpei Watanabe, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 10/248,781

(22) Filed: Feb. 18, 2003

(65) Prior Publication Data
US 2003/0235099 A1 Dec. 25, 2003

(30) Foreign Application Priority Data
Feb. 18, 2002 (JP) ........................................ 2002-039940

(51) Int. Cl.[7] .............................................. G06F 12/02
(52) U.S. Cl. ................................................. 711/5; 707/3
(58) Field of Search .......................... 711/5, 108; 707/7, 707/5, 6, 3

(56) References Cited

U.S. PATENT DOCUMENTS

| | | | | |
|---|---|---|---|---|
| 5,893,089 A | * | 4/1999 | Kikinis | 707/3 |
| 6,226,710 B1 | * | 5/2001 | Melchior | 711/108 |
| 6,314,506 B1 | * | 11/2001 | Stanton et al. | 711/220 |
| 6,532,468 B2 | * | 3/2003 | Ishida et al. | 707/101 |

* cited by examiner

Primary Examiner—Hiep T. Nguyen
(74) Attorney, Agent, or Firm—Anthony J. Canale

(57) ABSTRACT

A distributor and a search controller are added to the memory. A search is performed with an algorithm such as quick search by repeating reading of memory cells, comparing of the reading result, and narrowing down of entries to be compared based on the comparison result. Performing this sequential processing in the memory provides valid data in a bus time plus about half of a cycle time required in repeating reading a conventional memory. Then, the latter half of the cycle time can be used for comparison, as well as generation of the next memory cell address, so that the search can be finished in a bus time multiplied by the number of repetitions of reading the memory cells plus one bus time. As a result, a CAM function can be achieved that allows for more than tens of thousands of entry data items, the number of which is equal to the size of DRAM divided by the number of banks, rather than hundreds or thousands of entry data items as conventional CAM.

10 Claims, 4 Drawing Sheets

SEARCH MEMORY, MEMORY SEARCH CONTROLLER, AND MEMORY SEARCH METHOD

BACKGROUND OF INVENTION

1. Field of the Invention

The present invention generally relates to a data (content) search, and more particularly to a search memory, a memory search controller, and a memory search method for searching a large amount of data at a high speed.

2. Background of the Invention

Conventionally, a common content search is performed by, for example, the following steps. A database is sorted in ascending or descending order to create a table, and data is retrieved (i.e. referred to as "entry data") at the center of the table. Given data (i.e. "search data") is compared to the entry data. If the search data is after the entry data, subsequent entry data is selected and retrieved at the center of the latter half of the database. On the contrary, if the search data is prior to the entry data, subsequent entry data is selected and retrieved at the center of the former half of the database. The selected entry data from the latter or former half of the database is compared to the search data. The steps of comparison of the search data and the entry data, and the entry data selection are repeated to until the entry data matches the search data. This conventional method is called quick sort (quick search).

In this conventional search, it is required to read the entry data from memory that stores the database for each time the data is to be retrieved from the database (table), and to repeat reading and comparison of the data. This takes a long time for a search of massive entry data like a database. To shorten the search time, the repetitions of reading and comparison have to be done quickly. These repetitions may be made faster by executing multiple searches simultaneously (i.e. in parallel). However, since a Central Processing Unit (CPU) performs the comparison in conventional techniques, simultaneous execution of multiple searches will require combinations of multiple CPUs and memory units.

Thus, searching a large amount of data at a high speed without requiring combinations of multiple CPUs and memory units is desired.

SUMMARY OF INVENTION

An object of the present invention is to search a large amount of data (content) at a high speed.

Another object of the invention is to perform multiple searches simultaneously (in parallel) without requiring combinations of a plurality of CPUs and memory units.

The present invention realizes high-speed searches by adding in-memory circuitry (i.e. a controller) for searching, and by dividing memory cells into a plurality of banks to assign a search to each bank for simultaneously performing multiple searches.

Use of the present invention provides the following features. A memory controller external to the memory can sequentially issue search commands up to a maximum number of memory banks, rather than issuing a search command and waiting until the result is returned. Once the search commands are received, each bank that is not in operation can be assigned a search operation for simultaneous searches. Therefore, as opposed to conventional Content Addressable Memory (CAM), the number of entries to be searched can be increased up to the size of memory given as Dynamic Random Access Memory (DRAM) divided by the number of banks. In other words, the search memory of the present invention functions as CAM that allows for a vast number of entries.

According to the present invention, a small amount of circuitry (such as a search controller) is added in the memory. A search is performed with an algorithm such as quick search by repeating reading of the memory cells, comparison of the reading result, and narrowing down of entries to be compared based on the comparison result. Performing this sequential processing in the memory provides valid data in a bus time plus about half of a cycle time required in repeating reading a conventional memory. Then, the latter half of the cycle time can be used for comparison, as well as generation of the next memory cell address, so that the search can be finished in a bus time multiplied by the number of repetitions of reading the memory cells plus one bus time. As a result, a CAM function can be achieved that allows for more than tens of thousands of entry data items, the number of which is equal to the size of DRAM divided by the number of banks, rather than hundreds or thousands of entry data items as conventional CAM.

The invention can be implemented, for example, as follows.

A search memory comprising: memory cells that constitute at least two banks; and a search controller.

A search memory comprising: memory cells that constitute at least two banks; search controllers; and a distributor.

A memory search controller connected to a CPU via an interface and further to a memory having at least two banks, the memory search controller comprising: an address generator for generating a search address for the memory based on searching address information received from the CPU; and a comparator for comparing data stored in the bank that corresponds to the search address with search data received from the CPU.

A method for searching a memory having at least two banks, the method comprising the steps of: (a) receiving search address information and search data;

(b) generating a search address based on the search address information;

(c) detecting a searchable one of the banks;

(d) reading data corresponding to the search address in the detected searchable bank; and (e) comparing the read data with the search data.

DETAILED DESCRIPTION

Figure 1:
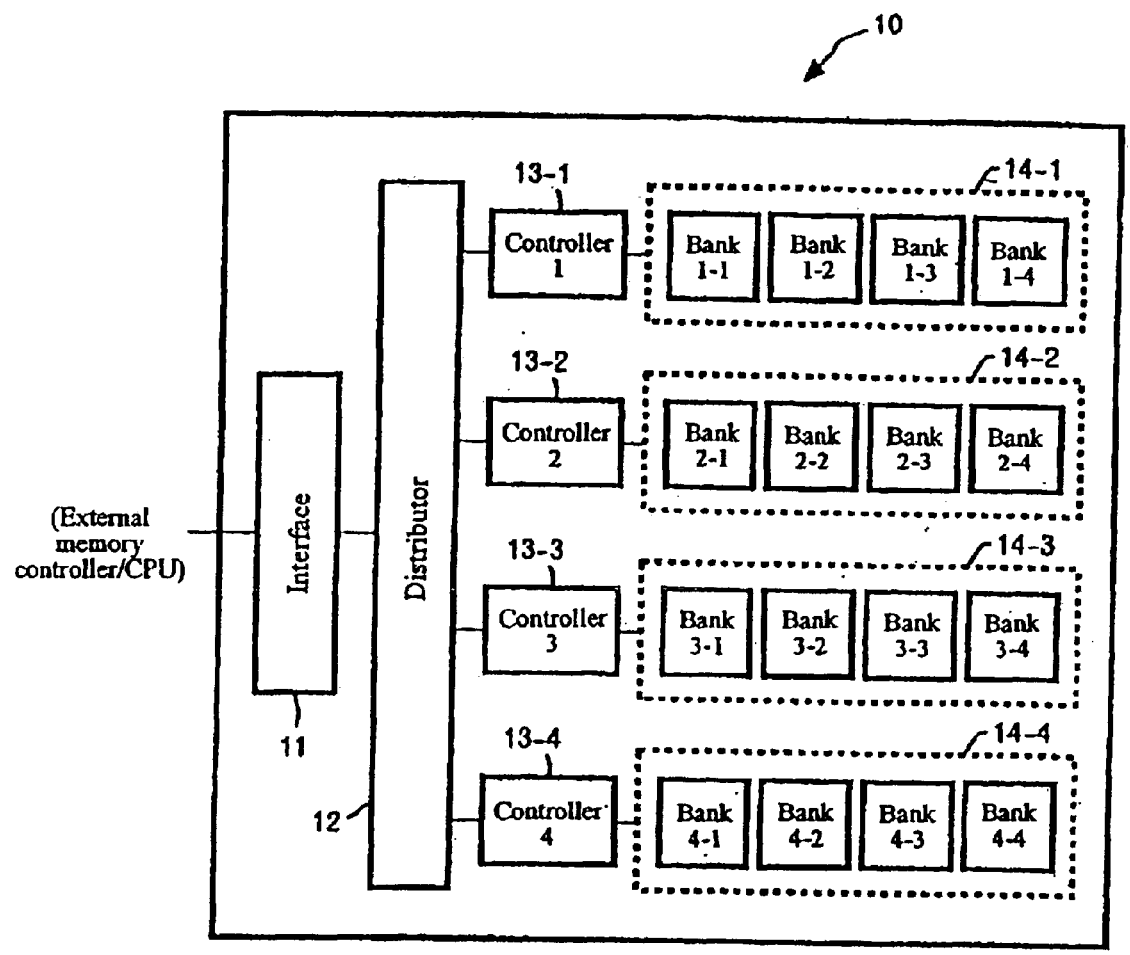
FIG. 1 shows a configuration of an exemplary search memory according to the present invention.

Referring to the drawings, a preferred embodiment of the present invention will be described. FIG. 1 shows an exemplary search memory according to the present invention. The memory is divided into 16 banks (1-1 to 4-4), which are grouped into four groups 14-1 to 14-4 with four banks each. For each bank group 14-1 to 14-4, an in-memory controller (memory search controller) 13-1 to 13-4 is provided. The banks are not limited to this configuration, but any number of banks and groups can be employed. In addition, DRAM is used as the memory by way of example, but other types of memory may also be used. The memory search controllers 13-1 to 13-4 are connected to a distributor 12. The distributor 12 is connected to an external memory controller/CPU (not shown) via an interface 11. The configuration shown in FIG. 1 is characterized in that the memory 10 has the internal memory search controllers 13 incorporated therein, and the memory banks form groups 14-1 to 14-4 and each group 14-1 to 14-4 is provided with the search controller 13-1 to 13-4, respectively.

As used herein, the "data (content) search" means finding information that matches certain information to be retrieved among pieces of information such as data that can be stored in storage means, for example, a semiconductor memory such as a DRAM.

Generally, the search memory according to the present invention and shown in FIG. 1 operates as described below. When data is written to the memory 10, identical data is simultaneously written to all banks in one write operation. When data is read from the memory 10, a bank readable at the time of access, i.e. a bank not executing a search is selected, and the data is read from the bank. When the distributor 12 receives a search command from the external memory controller (CPU), the distributor 12 selects one of the memory search controllers 13 that has a bank not used for a search and sends the search command to the controller 13. Upon receiving the search command, the controller 13 starts searching with the unused bank.

Figure 2:
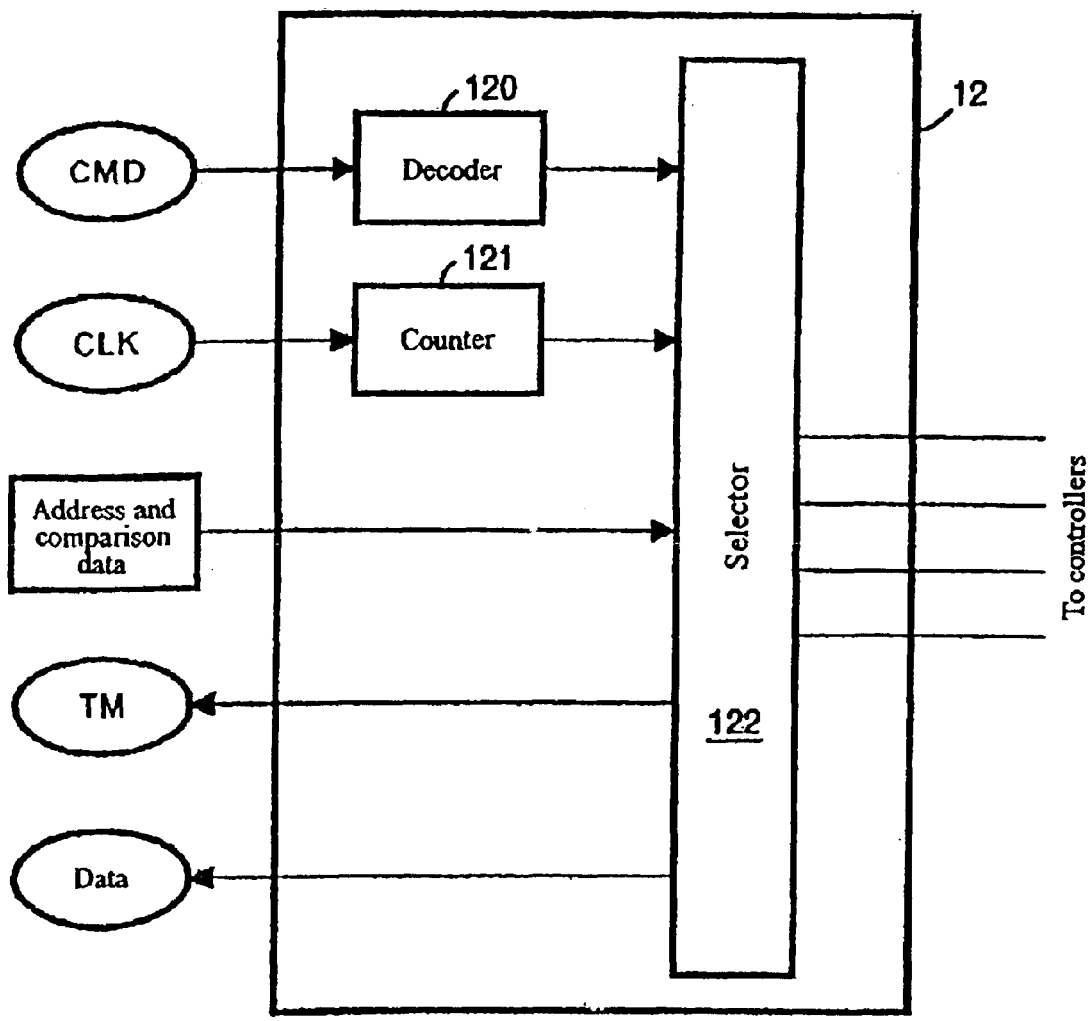
FIG. 2 shows a configuration of an exemplary distributor according to the present invention.

FIG. 2 shows an exemplary configuration of the distributor 12. The distributor 12 includes a decoder 120, a counter 121, and a selector 122. In FIG. 2, an input clock (CLK) causes operation (i.e. counting) of the counter 121, which corresponds to the number of the banks. Hereafter, it is assumed that the counter increases by one per half clock. The decoder 120 decodes a command sent from a command bus. If the command is a search command, the selector 122 assigns (i.e. selects) one of the controllers 13 to the search command according to the number of the counter for sending a received address and comparison data. For example, if the number of the operating counter 121 is 0–3, the controller 13-1 (see FIG. 1) is selected, and if the number is 4–7, the controller 13-2 is selected. The address and comparison data are sent from the selector 122 to the selected controller for searching. After a certain search is performed, the selector 122 is connected to the corresponding controller 13 according to the number of the counter 121 to receive a data signal and a timing signal (TM) from the controller 13 and output the data signal and the TM signal to the CPU.

Figure 3:
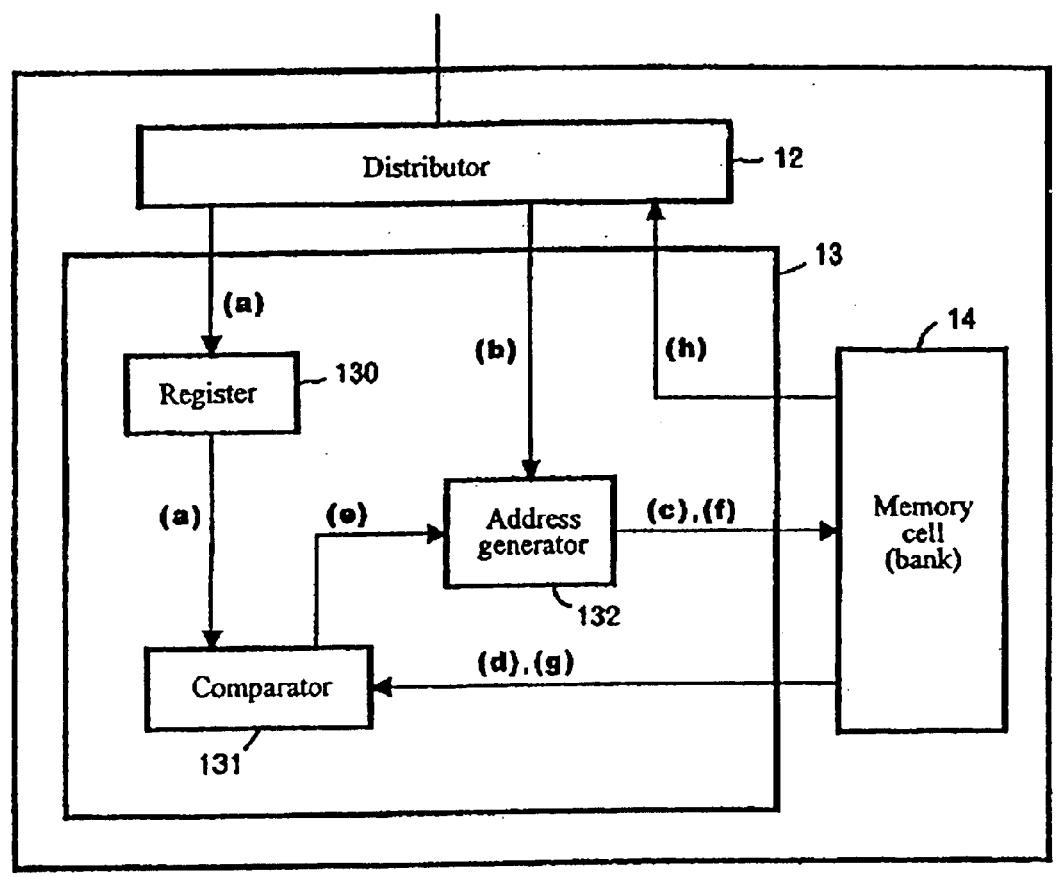
FIG. 3 shows an exemplary configuration of the search controller according to the present invention.

FIG. 3 shows an exemplary configuration of the controller 13 according to the present invention. The controller 13 includes a register 130, a comparator 131, and an address generator 132. The register 130 stores the comparison data (content) sent from the distributor 12 and outputs it to the comparator 131 via path (a). The address generator 132 refers to the address information (i.e. address search range A) sent from the distributor 12 via path (b). The address generator 132 generates and outputs an address for reading from the bank (memory cells) 14 via path (c). Here, an address at the center of the address search range A is generated by the address generator 132. Data corresponding to the generated address is read from the bank 14 and is input to the comparator 131 via path (d). The comparator 131 compares the comparison data sent from the distributor 12 with the data read from the bank 14. The comparator 131 outputs the comparison result in terms of order between the two pieces of data (i.e. "greater than" or "less than" or "equal to") to the address generator 132 via path (e).

Based on the comparison result, the address generator 132 selects the former or latter half of the address search range A (hereinafter referred to as range B). The address generator 132 generates an address at the center of the selected range B as a new address to be read and outputs it to the bank 14 via path (f). Data corresponding to the newly generated address is read from the bank 14 and is input to the comparator 131 via path (g). This sequential operation is repeated until the address search range becomes minimum ("1") or until a data match (comparison result is "equal to") is obtained, at which point the search is completed. Based on the search result, the controller 13 outputs the data, or information on the "match" or "mismatch", to the external memory controller (CPU) via the distributor 12 and the interface 11 via path (h). This search operation exemplifies the case where a quick sort algorithm is used.

Figure 4:
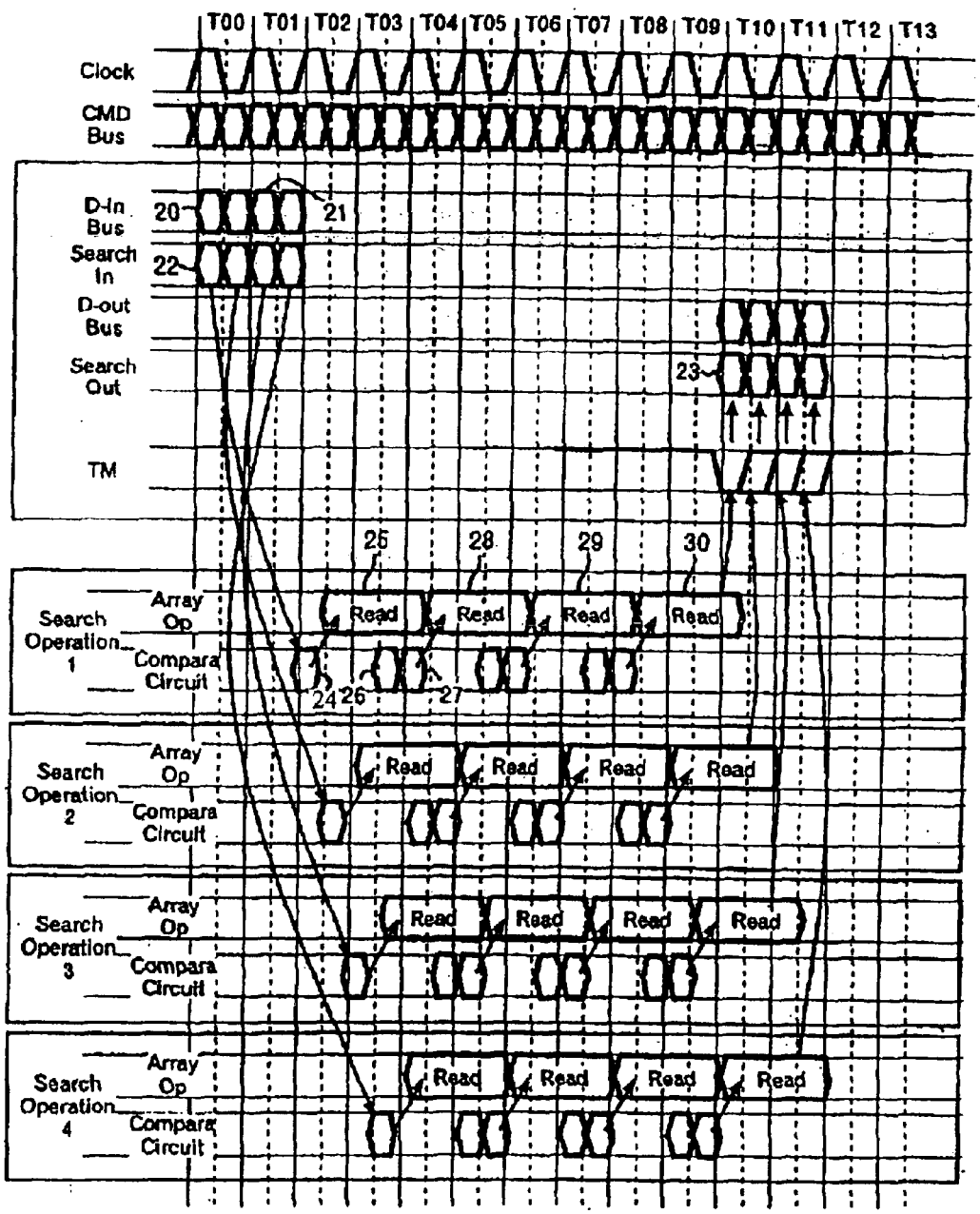
FIG. 4 shows exemplary timings of the search controller according to the present invention.

FIG. 4 shows exemplary timings of the search controller 13-1 according to the present invention. This is an example where a quick sort (quick search) algorithm is used. In the former half of clock period "T00", search data is input to a bus (interface), while a start address in a search range (group of addresses) is input to an address bus D-In (20). With the same timing, the number of entries (range) to be searched and the number of effective bits of data (the number of effective bits of entry data to be searched for) are input to a Search In Bus (22).

In the former half of clock period "T02" in Search Operation 1 (24) of FIG. 4, an address at the center of the search range is calculated from the given start and end addresses, and data corresponding to the address is read from the memory cell array. The data is determined in the middle of the cycle time (25). The determined data and the given entry data to be searched for are compared (26), and the next address is generated depending on the comparison result (relationship in terms of order: "greater than" or "less than" or "equal to") (27). After four memory cycles (25, 28, 29, 30) are executed in this manner, the search results along with the search numbers are returned to a Search Out Bus (23).

The exemplary Search Operations 2 to 4 in FIG. 4 show the relation between one of the search controllers (for example, 13-1) and its four banks (for example, 14-1) as shown in FIG. 1. FIG. 4 illustrates the timings with which the one controller controls the four banks, where each memory cycle time (25, 28, 29, 30) is two clocks, the address calculation for the memory cell array (27) takes ½ clock, and the data comparison (26) takes ½ clock. That is, in the example of FIG. 4, if a memory and an operation clock with the cycle time of 8 ns are used and each search is done in four cycles, search commands corresponding to two clocks yield four search results after 32 ns (8 ns×4=32 ns). Therefore, one search per 8 ns is possible. Using other operation blocks, that is, other controllers and their groups of four banks (as shown in FIG. 1) in parallel (i.e. adding the operation blocks), a search is possible at the rate of "8 ns divided by the number of operation blocks". As a result, given four operation blocks, for example, one search command that is input via the bus (interface) from the external controller (CPU) enables one search in 2 ns at the maximum in the search memory.

As described above, the present invention enables multiple searches simultaneously by dividing the memory cells into a plurality of banks and storing identical content in each bank. Therefore, the present invention enables a high-speed search of large amount of data, which has been difficult with conventional searches using CAM.

For example, the invention is especially effective in, for example, a network switch or router in which a Media Access Control (MAC) address table with hundreds of thousands of entries needs to be searched at a high speed within a packet processing period for a destination MAC address of a received packet.

While the invention has been described above with reference to the preferred embodiments whereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A search memory comprising:

memory cells that constitute at least two banks, each of said banks storing identical data; and a search controller connected to said memory cells and connected via an interface to an external CPU, said search controller including an address generator for generating a search address for said memory cells based on searching address information received from said CPU, and a comparator for comparing data stored in said bank that corresponds to said search address with search data received from said CPU.

2. The search memory according to claim 1, wherein said search controller includes a register for storing said search data received from said CPU.

3. The search memory according to claim 1, wherein said at least two banks comprise a first bank in a first bank group and a second bank in a second bank group, and further wherein a first search controller is connected to said first bank group and a second search controller is connected to said second bank group.

4. The search memory according to claim 3, wherein said first and second search controllers are connected to a distributor, said distributor responding to a search command received from said CPU to send said search command to said first or second search controllers that corresponds to a searchable one of the first or second banks.

5. A search memory comprising:

memory cells that constitute at least two banks;

a search controller connected to said memory cells and provided for a corresponding bank group that consists of at least one of the banks; and a distributor connected to said search controller and connected via an interface to an external CPU, said distributor responding to a search command received from said CPU to send said search command to said search controller that corresponds to a searchable one of the banks.

6. The search memory according to claim 5, wherein each of said banks stores identical data.

7. The search memory according to claim 5, wherein said search controller includes:

an address generator for generating a search address for said memory cells based on searching address information received from said CPU; and a comparator for comparing data stored in said bank that corresponds to said search address with search data received from said CPU.

8. A memory search controller connected to a CPU via an interface and further to a memory having at least two banks, said memory search controller comprising:

an address generator for generating a search address for said memory based on searching address information received from said CPU; and a comparator for comparing data stored in said bank that corresponds to said search address with search data received from said CPU.

9. A method for searching a memory having at least two banks, said method comprising the steps of:

(a) receiving search address information and search data;

(b) generating a search address based on said search address information;

(c) detecting a searchable one of said banks;

(d) reading data corresponding to said search address in said detected searchable bank; and (e) comparing the read data with said search data.

10. The method for searching a memory according to claim 9, further comprising the step of:

(f) storing identical data in each of said banks.

* * * * *